United States Patent
Zhang

(10) Patent No.: US 11,171,301 B2
(45) Date of Patent: Nov. 9, 2021

(54) ORGANIC LIGHT EMITTING DIODE AND METHOD FOR FABRICATING THE SAME

(71) Applicant: BOE TECHNOLOGY GROUP CO., LTD., Beijing (CN)

(72) Inventor: Can Zhang, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 473 days.

(21) Appl. No.: 16/097,793

(22) PCT Filed: Mar. 11, 2018

(86) PCT No.: PCT/CN2018/078650
§ 371 (c)(1),
(2) Date: Oct. 30, 2018

(87) PCT Pub. No.: WO2018/210040
PCT Pub. Date: Nov. 22, 2018

(65) Prior Publication Data
US 2021/0159442 A1 May 27, 2021

(30) Foreign Application Priority Data
May 15, 2017 (CN) .......................... 201710340284.2

(51) Int. Cl.
*H01L 51/52* (2006.01)
*H01L 27/32* (2006.01)
(Continued)

(52) U.S. Cl.
CPC ...... *H01L 51/5209* (2013.01); *H01L 27/3244* (2013.01); *H01L 51/0023* (2013.01);
(Continued)

(58) Field of Classification Search
None
See application file for complete search history.

(56) References Cited

U.S. PATENT DOCUMENTS

| 7,538,039 B2 * | 5/2009 | Sasagawa | H05K 3/06 438/713 |
| 7,692,197 B2 | 4/2010 | Park et al. | |

(Continued)

FOREIGN PATENT DOCUMENTS

| CN | 1575078 A | 2/2005 |
| CN | 101076869 A | 11/2007 |

(Continued)

OTHER PUBLICATIONS

Chinese Office Action dated Apr. 28, 2018, from Chinese Application No. 201710340284.2.

(Continued)

*Primary Examiner* — J. E. Schoenholtz
(74) *Attorney, Agent, or Firm* — Arch & Lake LLP

(57) ABSTRACT

A method for fabricating the organic light emitting diode includes providing a substrate, forming an anode electrode layer on the substrate, forming a passivation layer on the anode electrode layer, the passivation layer having an area smaller than that of the anode electrode layer, performing ion bombardment of the anode electrode layer and the passivation layer, and removing the passivation layer.

12 Claims, 4 Drawing Sheets

(51) Int. Cl.
  *H01L 51/00*   (2006.01)
  *H01L 51/56*   (2006.01)
(52) U.S. Cl.
  CPC ........ *H01L 51/56* (2013.01); *H01L 2227/323* (2013.01); *H01L 2251/308* (2013.01)

(56) References Cited

U.S. PATENT DOCUMENTS

| | | | |
|---|---|---|---|
| 7,989,351 | B2* | 8/2011 | Sasagawa ........... H01L 27/3276 438/706 |
| 8,669,663 | B2* | 3/2014 | Sasagawa ........... H01L 27/3276 257/775 |
| 2005/0110021 | A1 | 5/2005 | Park et al. |
| 2005/0245087 | A1* | 11/2005 | Sasagawa ......... H01L 21/32139 438/706 |
| 2009/0206494 | A1* | 8/2009 | Sasagawa ......... H01L 21/32139 257/784 |
| 2011/0240223 | A1* | 10/2011 | Matsubayashi ... H01L 21/67173 156/345.36 |
| 2011/0272816 | A1* | 11/2011 | Sasagawa ......... H01L 21/32136 257/773 |

FOREIGN PATENT DOCUMENTS

| | | |
|---|---|---|
| CN | 101076869 B | 5/2010 |
| CN | 103155227 A | 6/2013 |
| CN | 105449116 A | 3/2016 |
| CN | 106449717 A | 2/2017 |
| CN | 107086274 A | 8/2017 |
| JP | H01-306581 A | 12/1989 |
| JP | 2006-194926 A | 7/2006 |
| JP | 2006-196200 A | 7/2006 |
| JP | 2006-196201 A | 7/2006 |
| KR | 20070093098 A | 9/2007 |
| KR | 101039029 B1 | 6/2011 |
| TW | 200641490 A | 12/2006 |
| TW | I375099 B | 10/2012 |
| WO | WO-2006/075506 A1 | 7/2006 |

OTHER PUBLICATIONS

International Search Report and Written Opinion dated May 18, 2018, from application No. PCT/CN2018/078650.

* cited by examiner

ORGANIC LIGHT EMITTING DIODE AND METHOD FOR FABRICATING THE SAME

CROSS REFERENCE

The present application is based on International Application No. PCT/CN2018/078650, filed on Mar. 11, 2018, which is based upon and claims priority to Chinese Patent Application No. 201710340284.2, filed on May 15, 2017, and the entire contents thereof are incorporated herein by reference.

TECHNICAL FIELD

The present disclosure relates to the field of display technology, and in particular, to an organic light emitting diode and a method for fabricating the same.

BACKGROUND

Recently, high-resolution displays have become the goal of people, especially organic light-emitting diode (OLED) high-resolution displays have received much attention from the market with its unique advantages, such as fast response, full curing, self-illumination or the like.

During the process of fabricating high-resolution OLED display, a pixel define layer (PDL) limits the aperture ratio. However, if there is no pixel define layer, there will be a problem of short circuit caused by the overlap of the anode and the cathode.

SUMMARY

The present disclosure provides a method for fabricating an organic light emitting diode. The method includes providing a substrate. The method includes forming an anode electrode layer on the substrate. The method includes forming a passivation layer on the anode electrode layer. The passivation layer has an area smaller than an area of the anode electrode layer. The method includes performing ion bombardment on the anode electrode layer and the passivation layer. The method includes removing the passivation layer.

In an exemplary arrangement, the method for fabricating the organic light emitting diode further includes forming an organic electroluminescent layer on the anode electrode layer, and forming a cathode layer on the organic electroluminescent layer.

In an exemplary arrangement, the method for fabricating the organic light emitting diode further includes forming a pixel driving circuit structure layer between the substrate and the anode electrode layer.

In an exemplary arrangement, a slope angle of a corner of the anode electrode layer is between 10 and 60 degrees.

In an exemplary arrangement, the area of the passivation layer is 90% of that of the anode electrode layer.

The present disclosure also provides an organic light emitting diode. The organic light emitting diode includes a substrate and an anode electrode layer disposed on the substrate. A corner of the anode electrode layer has an obtuse angle with circular arc. The organic light emitting diode includes an organic electroluminescent layer covering the anode electrode layer and a cathode electrode layer disposed on the organic electroluminescent layer.

In an exemplary arrangement, a slope angle of the corner of the anode electrode layer is between 10 and 60 degrees.

In an exemplary arrangement, the corner of the anode electrode layer is a circular obtuse angle.

In an exemplary arrangement, the corner of the anode electrode layer is subject to a plasma treatment.

In an exemplary arrangement, the anode electrode layer is formed of indium tin oxide.

In an exemplary arrangement, the organic light emitting diode further includes a pixel driving circuit structure layer formed between the substrate and the anode electrode layer.

DETAILED DESCRIPTION

Figure 1:
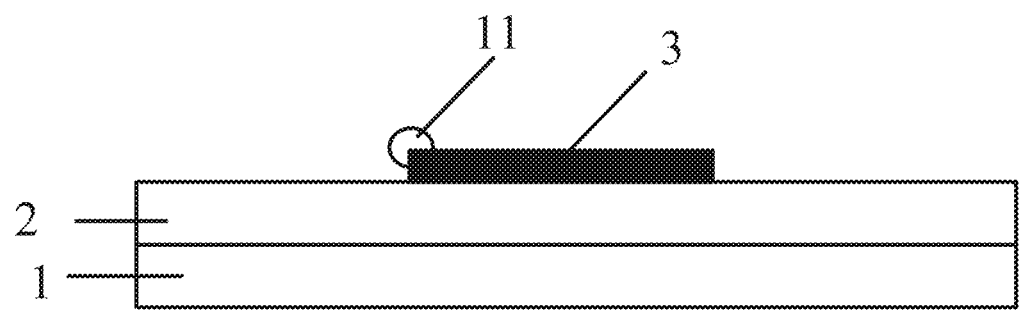
FIGS. 1 to 3 are process flow diagrams showing the fabrication of an organic light emitting diode in the related art.

The present disclosure will be further described in detail below in conjunction with the accompanying drawings and arrangements. It can be understood that the specific arrangements described herein are merely used for explaining the present disclosure and are not intended to be limiting of the present disclosure. It is also to be noted that, for the convenience of description, only some but not all of the structures related to the present disclosure are shown in the drawings.

Figure 2:
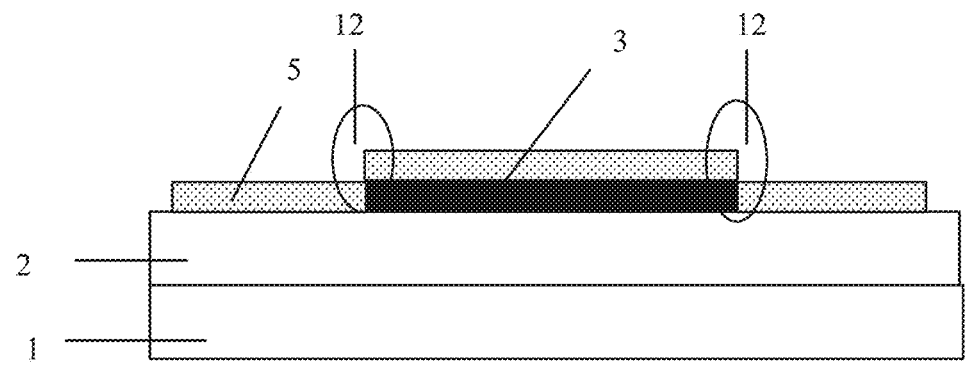
Figure 3:
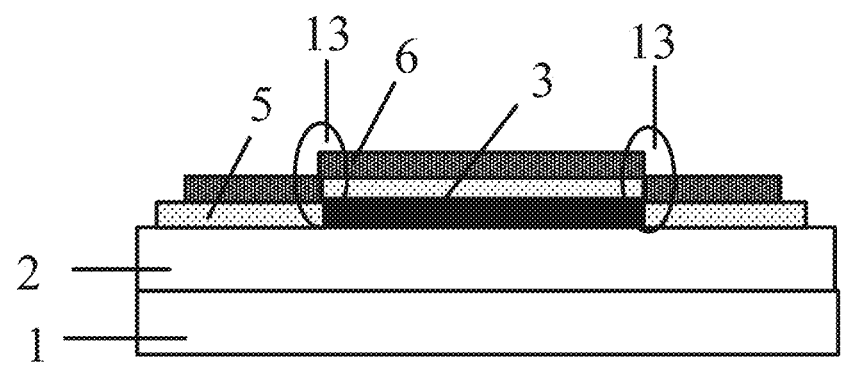

FIGS. 1 to 3 are process flow diagrams showing the fabrication of an organic light emitting diode in the related art.

In the related art, as shown in FIG. 1, first, a pixel driving circuit (array) structure layer 2 is fabricated on a substrate 1, and then a metal oxide layer, such as indium tin oxide (ITO), is fabricated on the pixel driving circuit structure layer 2, and a patterned anode electrode layer 3 is obtained by etching the ITO layer.

Figure 4:
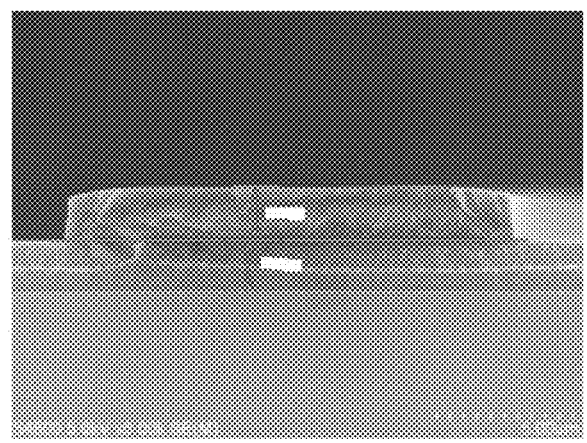
FIG. 4 is an electron scanning photograph of an ITO anode electrode layer after being etched in the related art.
Figure 5:
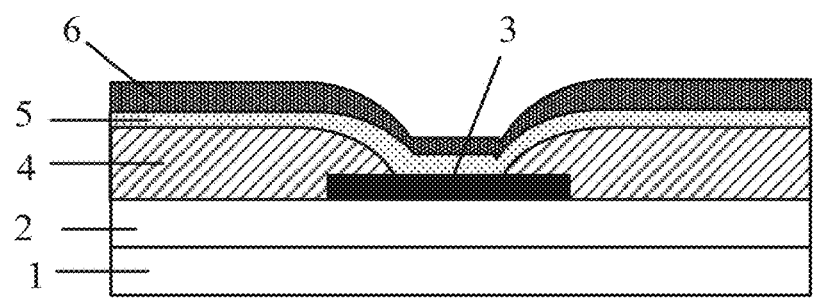
FIG. 5 is a schematic structural view of an organic light emitting diode according to the related art.

However, as shown in the portion 11 shown by the circled portion in FIG. 1, the etching angle of the anode electrode layer 3 has sharp edges. FIG. 4 is an electron scanning photograph of the ITO anode electrode layer after being etched, and FIG. 4 is a scanning view of an object. As can be seen from FIG. 4, the corners of the ITO anode electrode layer formed by etching are very sharp.

Next, as shown in FIG. 2, the organic electroluminescent layer 5 is formed on the anode electrode layer 3 by evaporating, since the etching edge angle of the anode electrode layer 3 is has sharp edges, the organic electroluminescent layer 5 cannot completely cover the anode electrode layer 3, as shown by the circled portion denoted by 12 in FIG. 2.

Next, as shown in FIG. 3, the cathode layer 6 is formed on the organic electroluminescent layer 5 by evaporating, since the organic electroluminescent layer 5 does not completely cover the anode electrode layer 3, the cathode and the anode are overlapped at the corners when the cathode if formed by evaporating, causing a cathode-anode short circuit, as shown by the circled portion denoted by 13 in FIG. 2.

In the related art, in order to avoid this, after the anode electrode layer 3 is etched, a pixel define layer (PDL) 4 is fabricated to cover sharp corners, and then the organic electroluminescent layer 5 and the cathode layer 6 are formed on the pixel define layer 4 by evaporating, such that the evaporated organic electroluminescent layer 5 completely isolates the anode electrode layer 3 from the cathode layer 6. A cross-sectional view of the obtained organic light-emitting diode is shown in FIG. 4.

However, the pixel define layer may block part of the anode and thus reduce the aperture ratio. Nowadays, the display is having higher resolution, and the pixel region is getting smaller and smaller, especially for the OLED display applied in the micro display field, which the pixel region has a size of only a few microns or even several microns. Therefore, it is especially important to remove the pixel define layer. That the pixel define layer is removed without causing the overlap of the cathode and the anode is the problem to be solved by the present disclosure.

Figure 6:
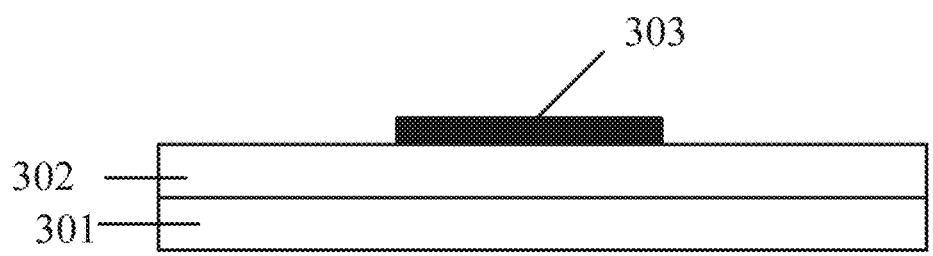
FIGS. 6 to 9 are process flow diagrams showing the fabrication of an organic light emitting diode according to an arrangement of the present disclosure.
Figure 7:
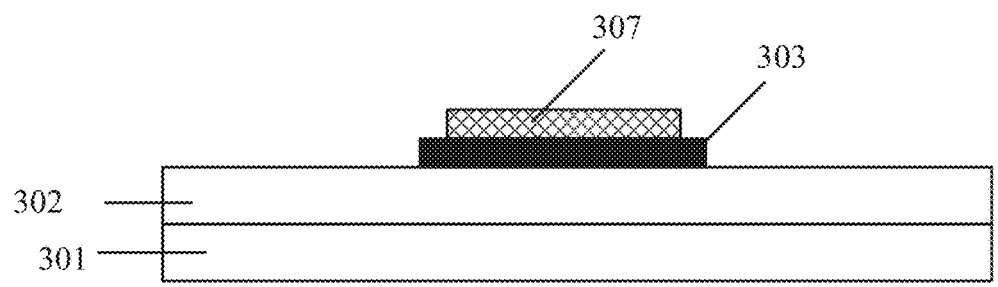
Figure 8:
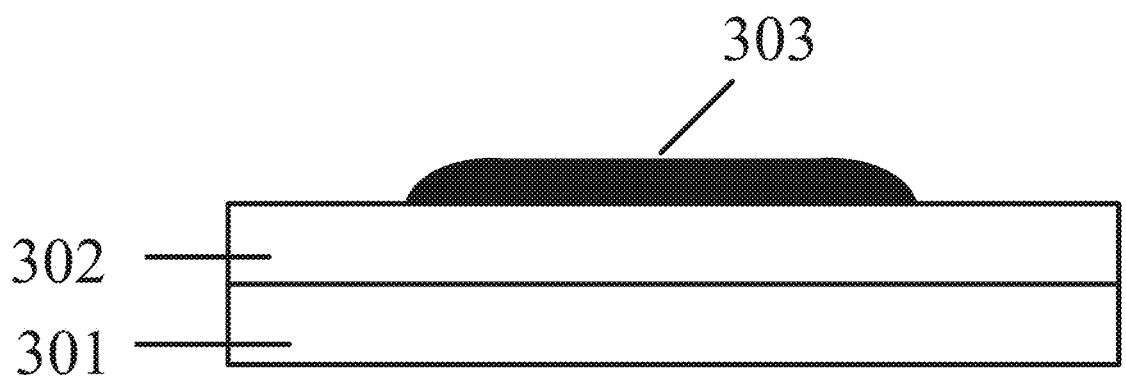

The present arrangement provides a method for fabricating an organic light emitting diode, and FIGS. 6 to 8 are process flow diagrams showing the fabrication of an organic light emitting diode according to an arrangement of the present disclosure.

As shown in FIG. 6, first, a substrate 301 is provided. A pixel driving circuit (array) structure layer 302 is fabricated on the substrate 301. A metal oxide layer, such as an indium tin oxide (ITO) layer, is fabricated on the pixel driving circuit structure layer 302 as the anode electrode layer 303.

Next, as shown in FIG. 7, a passivation layer 307 is fabricated on the anode electrode layer 303, and the material of the passivation layer 307 may be a dense inorganic film, such as $SiN_3$, $SiO_2$. The passivation layer is then etched into a pattern that is slightly smaller than the anode pattern, as shown in FIG. 7. In an exemplary arrangement, the size of the passivation layer is 90% of the size of the anode electrode layer 303, so that the processing cost and the subsequent etching effect on the anode pattern can be achieved.

Then, the anode electrode layer 303 is ion bombarded with ion bombardment equipment (e.g., dry etching equipment) using the passivation layer 307 as a mask. The ion bombardment conditions can be selected as follows. The power (W) is 500 W; the pressure (mT) is 60 mT; the temperature (° C.) is 50° C.; the gases (sccm) are chlorine gas 20 sccm, argon gas 400 sccm, and helium gas 300 sccm; and time (sec) is 80 seconds. The ion bombardment conditions described herein are exemplary conditions and are not intended to limit the present arrangement.

Figure 9:
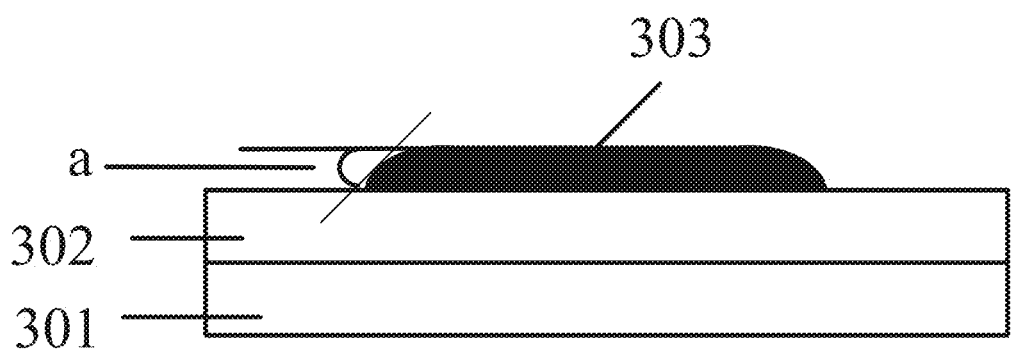

Since there is no protection of the passivation layer 307 at the corners of the anode electrode layer 303, the sharp corners are bombarded by ions into a an obtuse angle with circular arc. After the passivation layer is etched away, a pattern as shown in FIG. 8 can be obtained. As shown in FIG. 8, the corners of the anode electrode layer 303 are obtuse angles with circular arc. The slope angle of the corner of the anode electrode layer 303 is in the range of 10 to 60 degrees, and within this range, it is more advantageous to completely cover the anode electrode layer 303 by the organic electroluminescent layer 305 to be formed by evaporating below. Here, the slope angle of the corner of the anode electrode layer 303 is defined as the angle between the arc tangent at the corner of the anode electrode layer and the plane of the anode electrode layer 303, as shown by the angle denoted by a in FIG. 9.

Figure 10:
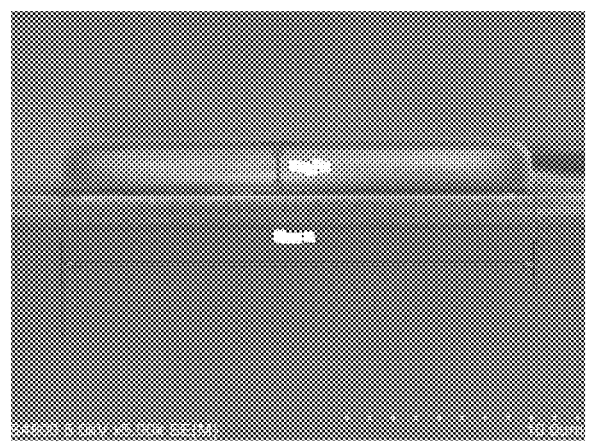
FIG. 10 is an electron scanning photograph of an ITO anode electrode layer after being performed by ion bombardment.

FIG. 10 is an electron scanning photograph of an ITO anode electrode layer 303 after being performed by ion bombardment, as can be seen from FIG. 10, after the anode electrode layer 303 is performed by the ion bombardment, the angle with sharp edges becomes an angle with circular arc.

Figure 11:
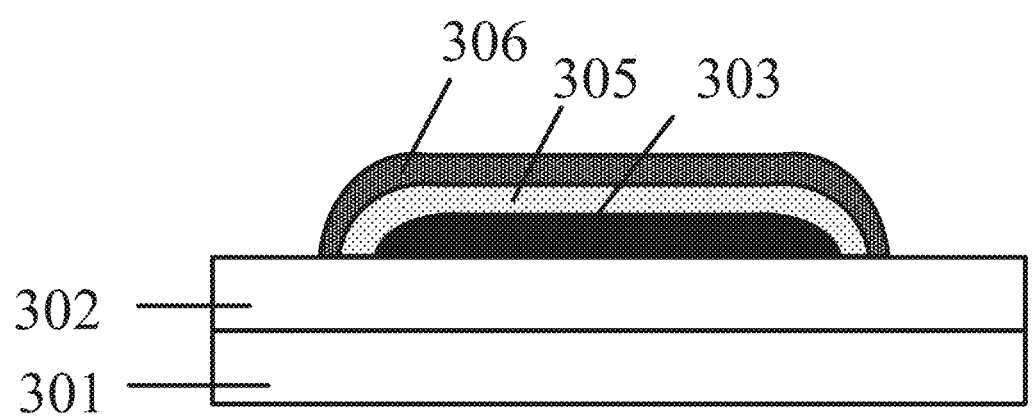
FIG. 11 is a schematic structural view of an organic light emitting diode according to an arrangement of the present disclosure.

Then, the organic electroluminescent layer 305 and the cathode layer 306 are formed on the anode electrode layer 303 by evaporating, and the schematic structural view of the obtained organic light-emitting diode is shown in FIG. 11

Since the corner of the anode electrode layer 303 is an obtuse angle with circular arc, the organic electroluminescent layer 305 can completely cover the anode electrode layer 303 when forming the organic electroluminescent layer 305 on the anode electrode layer 303 by evaporating. Then it is possible to prevent a short circuit caused by the overlap of the anode and the cathode when forming the cathode 306 by evaporating. In addition, a pixel define layer is not needed for achieving isolation of the cathode layer from the anode electrode layer.

According to the method for fabricating the organic light emitting diode of the present arrangement, an anode electrode layer having an obtuse angle with circular arc can be obtained, preventing a short circuit caused by the overlap of the anode and the cathode, and there is also no need a pixel define layer to achieve isolation of the cathode layer from the anode electrode layer at the same time, improving the aperture ratio and yield of the organic light emitting diode.

The present arrangement provides an organic light emitting diode.

FIG. 11 is a schematic structural view of an organic light emitting diode according to an arrangement of the present disclosure. As shown in FIG. 11, the organic light emitting diode according to the present arrangement includes a substrate 301, a pixel driving circuit structure layer 302 disposed on the substrate 301, an anode electrode layer 303 disposed on the pixel driving circuit structure layer 302, an organic electroluminescent layer 305 completely covering the anode electrode layer 303, and a cathode electrode layer 306 disposed on the organic electroluminescent layer 305.

In this arrangement, the anode electrode layer 303 is subject to a plasma treatment, and has an obtuse angle with circular arc. The slope angle of the corner of the anode electrode layer 303 is between 10 and 60 degrees. Within this range, the coverage of the anode electrode layer 303 by the organic electroluminescent layer 305 is more advantageous.

The specific plasma treatment method is as follows. Fabricating a passivation layer having a smaller area than the anode electrode layer 303 on the anode electrode layer 303, and treating the anode electrode layer 303 by plasma with the passivation layer as a mask to obtain an anode electrode layer 303 having a circular obtuse angle, and then removing the passivation layer. For example, the anode electrode layer may be formed of indium tin oxide.

According to the organic light emitting diode of the present arrangement, wherein the corner of the anode electrode layer has an obtuse angle with circular arc, so that the organic electroluminescent layer can completely cover the anode electrode layer, preventing short circuit caused by the overlap of the anode and the cathode. In addition, a pixel define layer is not needed for achieving isolation of the cathode layer from the anode electrode layer, and the aperture ratio and yield of the organic light emitting diode is improved.

It is noted that the foregoing is only the preferred arrangement of the present disclosure and the principles of the techniques employed. It should be understood by those skilled in the art that the present disclosure is not limited to the specific arrangements described herein, and that various modifications, changes and substitutions may be made without departing from the scope of the present disclosure. Therefore, although the present disclosure has been described in detail by the above arrangements, the present disclosure is not limited to the above arrangements, and further arrangements may be included without departing from the inventive concept, and the scope of the present disclosure is determined by the appended claims.

What is claimed is:

1. A method for fabricating an organic light emitting diode, comprising:
    providing a substrate;
    forming an anode electrode layer on the substrate;
    forming a passivation layer on the anode electrode layer, the passivation layer having an area smaller than an area of the anode electrode layer, and the area of the passivation layer is 90% of the area of the anode electrode layer, a material of the passivation layer comprising $SiN_3$ or $SiO_2$;
    performing ion bombardment on the anode electrode layer and the passivation layer; and
    removing the passivation layer.

2. The method for fabricating an organic light emitting diode according to claim 1, further comprising:
    forming an organic electroluminescent layer on the anode electrode layer, and
    forming a cathode layer on the organic electroluminescent layer.

3. The method for fabricating an organic light emitting diode according to claim 1, further comprising:
    forming a pixel driving circuit structure layer between the substrate and the anode electrode layer.

4. The method for fabricating an organic light emitting diode according to claim 1, a slope angle of a corner of the anode electrode layer is between 10 and 60 degrees.

5. An organic light emitting diode, comprising;
    a substrate;
    an anode electrode layer disposed on the substrate, a corner of the anode electrode layer having an obtuse angle with circular arc, and the corner of the anode electrode layer is subject to a plasma treatment, wherein a passivation layer has an area smaller than an area of the anode electrode layer, and the area of the passivation layer is 90% of the area of the anode electrode layer, a material of the passivation layer comprising $SiN_3$ or $SiO_2$;
    an organic electroluminescent layer completely covering the anode electrode layer to prevent a short circuit caused by overlap of the anode and the cathode, and to achieve isolation of the cathode layer from the anode electrode layer without a pixel define layer; and
    a cathode electrode layer disposed on the organic electroluminescent layer.

6. The organic light emitting diode according to claim 5, wherein a slope angle of the corner of the anode electrode layer is between 10 and 60 degrees.

7. The organic light emitting diode according to claim 5, wherein the anode electrode layer is formed of indium tin oxide.

8. The organic light emitting diode according to claim 5, wherein the organic light emitting diode further comprises a pixel driving circuit structure layer formed between the substrate and the anode electrode layer.

9. The method for fabricating an organic light emitting diode according to claim 3, a slope angle of a corner of the anode electrode layer is between 10 and 60 degrees.

10. The organic light emitting diode according to claim 6, wherein the anode electrode layer is formed of indium tin oxide.

11. The organic light emitting diode according to claim 6, wherein the organic light emitting diode further comprises a pixel driving circuit structure layer formed between the substrate and the anode electrode layer.

12. The organic light emitting diode according to claim 7, wherein the organic light emitting diode further comprises a pixel driving circuit structure layer formed between the substrate and the anode electrode layer.

* * * * *